United States Patent
Kenganantanon et al.

(10) Patent No.: US 7,927,921 B2
(45) Date of Patent: Apr. 19, 2011

(54) SEMICONDUCTOR DIE ATTACHMENT METHOD USING NON-CONDUCTIVE SCREEN PRINT AND DISPENSE ADHESIVE

(75) Inventors: Ekgachai Kenganantanon, Bangkok (TH); Surapol Sawatjeen, Bangkok (TH)

(73) Assignee: Microchip Technology Incorporated, Chandler, AZ (US)

( * ) Notice: Subject to any disclaimer, the term of this patent is extended or adjusted under 35 U.S.C. 154(b) by 161 days.

(21) Appl. No.: 12/472,675

(22) Filed: May 27, 2009

(65) Prior Publication Data

US 2010/0304532 A1  Dec. 2, 2010

(51) Int. Cl.
*H01L 21/00* (2006.01)
(52) U.S. Cl. ........ 438/113; 438/110; 438/111; 438/112; 438/114
(58) Field of Classification Search .......... 438/110–114, 438/118; 257/E23.003, E23.005, E23.141
See application file for complete search history.

(56) References Cited

U.S. PATENT DOCUMENTS

| | | | |
|---|---|---|---|
| 5,208,188 A * | 5/1993 | Newman | 156/310 |
| 6,353,268 B1 * | 3/2002 | Cobbley et al. | 257/796 |
| 2005/0189658 A1 * | 9/2005 | Xiaochun et al. | 257/782 |
| 2008/0241998 A1 * | 10/2008 | Swirbel | 438/113 |

* cited by examiner

*Primary Examiner* — Michael S Lebentritt
*Assistant Examiner* — Karen M Kusumakar
(74) *Attorney, Agent, or Firm* — King & Spalding L.L.P.

(57) ABSTRACT

A uniform layer of non-conductive material, e.g., epoxy, is screen printed onto the backside of an integrated circuit wafer to a required thickness, and then heated until it is hard cured (C-stage). The integrated circuit wafer having the hard cured coating is then sawn apart to separate the individual integrated circuit dice. A non-conductive adhesive is dispensed onto mating faces of die attach paddles of leadframes. The dice are placed into the non-conductive adhesive and then the die and die attach paddle assembly are heated to hard cure the adhesive between the mating faces of the die and die attach paddle. This provides long term electrical isolation of the integrated circuit die from the die attach paddle, and effectively eliminates silver migration from the die attach paddle which causes conductive paths to form that increase unwanted leakage currents in the die and ultimately cause failure during operation thereof.

11 Claims, 2 Drawing Sheets

SEMICONDUCTOR DIE ATTACHMENT METHOD USING NON-CONDUCTIVE SCREEN PRINT AND DISPENSE ADHESIVE

TECHNICAL FIELD

The present disclosure relates to attachment of semiconductor integrated circuit dice to leadframes, and more particularly, to attachment of the semiconductor dice to respective die attach paddles of the leadframes by using non-conductive screen print and dispense adhesive that also electrically isolates the semiconductor die from the leadframe die attach paddle.

BACKGROUND

During fabrication of semiconductor integrated circuits, a semiconductor integrated circuit die (backside thereof) is attached to a die attach paddle of a leadframe. Then bond pads of the semiconductor integrated circuit die are attached to conductors of the leadframe with bond wires. Typically, the backside of the semiconductor integrated circuit die is attached to the die attach paddle of the leadframe with an adhesive such as epoxy. Over time, conductive paths may form between the semiconductor integrated circuit die and the die paddle of the leadframe. These conductive paths may be created by migration of silver from the die attach paddle of the leadframe to the backside of the integrated circuit die. Eventually this silver migration creates a connection between the backside of the semiconductor integrated circuit die and the die paddle, thus causing an electrical short therebetween.

Silver molecules from the die attach paddle can migrate over time when there is an electrical potential difference between the semiconductor integrated circuit die and the die attach paddle. This electrical potential difference is present when operating and/or standby power is applied to the semiconductor integrated circuit die. Silver migration is particularly active when the semiconductor integrated circuit die is drawing low quiescent current, e.g., during a standby mode of operation (sleep mode). Running the semiconductor integrated circuit die at a low quiescent current is necessary so that the semiconductor integrated circuit die may be brought from the standby (sleep) mode to an operating mode. Silver migration creates electrical paths between the semiconductor integrated circuit die and the die attach paddle and thereby causes high quiescent current in the semiconductor integrated circuit die to the point eventually where the circuits of the semiconductor integrated circuit die fail.

Various physical attachment configurations have been used to electrically isolate the semiconductor integrated circuit die from the die attach paddle. One such attachment configuration uses non-conductive epoxy to achieve physical attachment and electrical isolation. However, this has proven over time to be ineffective and unreliable in preventing high quiescent currents due to conductive paths between the semiconductor integrated circuit die and the die attach paddle.

Another similar but more effective approach is to screen print one or two layers of non-conductive epoxy onto the backside of an integrated circuit wafer. The integrated circuit wafer comprises a plurality of semiconductor integrated circuit dice. The screen printed epoxy is partially cured (B-stage) and is thereafter ready for singulation into individual dice. The individual integrated circuit dice are then attached to respective die attach paddles of a plurality of leadframes by heating the die attach paddles then scrubbing the non-conductive B-stage epoxy coated dice onto the heated die attach paddles. After the dice have been attached to the respective die attach paddles, they are heated until the non-conductive B-stage epoxy is hard cured (C-stage). This form of attachment does solve the silver migration problem long term, but the useful storage life of the B-stage epoxy integrated circuit wafer is only about two to four weeks.

SUMMARY

Therefore, a need exists for a better way of coating the backside of a semiconductor integrated circuit wafer with a non-conductive material so that the coating has a long storage (shelf) life, aids in the attachment of singulated semiconductor integrated circuit dice to die attach paddles of leadframes, and prevents or substantially reduces silver migration from the die attach paddle during operation of the semiconductor integrated circuit die.

According to teachings of this disclosure, a uniform layer of non-conductive material, e.g., epoxy, is screen printed onto the backside of an integrated circuit wafer to a required thickness, and then heated until it is hard cured (C-stage). The screen printing may apply the non-conductive material in a pattern onto the backside of the integrated circuit wafer. The integrated circuit wafer, having the hard cured coating thereon, is then sawn apart to separate each individual integrated circuit die from each other in the wafer (singulated) for preparation to be attached to respective die attach paddles of leadframes. The required thickness may be from about one to three milli-inches, preferably from about 1.5 to 2.5 milli-inches, and most preferably about two milli-inches.

During the process of attaching the die to a die attach paddle, a non-conductive adhesive, e.g., epoxy, is dispensed onto the mating face of the die attach paddle. Then the face of the die having the hard cured coating is placed into the recently dispensed non-conductive adhesive on the mating face of the die attach paddle. Next the die and die attach paddle assembly are heated to hard cure the adhesive between the mating faces of the die and die attach paddle. After the adhesive has been hard cured, the integrated circuit bond pads may be wire bonded to the leadframe leads (conductive leads used for the finished integrated circuit external circuit connections). Thereby providing long term electrical isolation of the integrated circuit die from the die attach paddle of the leadframe, and effectively eliminating silver migration from the die attach paddle which causes conductive paths to form that increase unwanted leakage currents in the die and ultimately cause failure during operation thereof.

According to a specific example embodiment of this disclosure, a method for attaching semiconductor dice to leadframe die attach paddles comprises the steps of: applying a non-conductive material to a back face of a semiconductor integrated circuit wafer, the semiconductor integrated circuit wafer comprising a plurality of integrated circuit dice; heating the semiconductor integrated circuit wafer and the non-conductive material thereon until the non-conductive material is hard cured; mounting the semiconductor integrated circuit wafer on a wafer carrier; wherein the hard cured non-conductive material is between the semiconductor integrated circuit wafer and the wafer carrier; separating each of the plurality of integrated circuit dice from each other; dispensing non-conductive adhesive on faces of die attach paddles of a plurality of leadframes; placing the plurality of integrated circuit dice into the non-conductive adhesive on the faces of respective ones of the die attach paddles; heating the plurality of integrated circuit dice and die attach paddles until the non-conductive adhesive is hard cured; attaching bond pads of the plurality of integrated circuit dice to respective conductive leads of the plurality of leadframes with bond wires; and separating each of the plurality of leadframes into integrated circuits.

BRIEF DESCRIPTION OF THE DRAWINGS

A more complete understanding of the present disclosure may be acquired by referring to the following description taken in conjunction with the accompanying drawings wherein.

Figure 1:
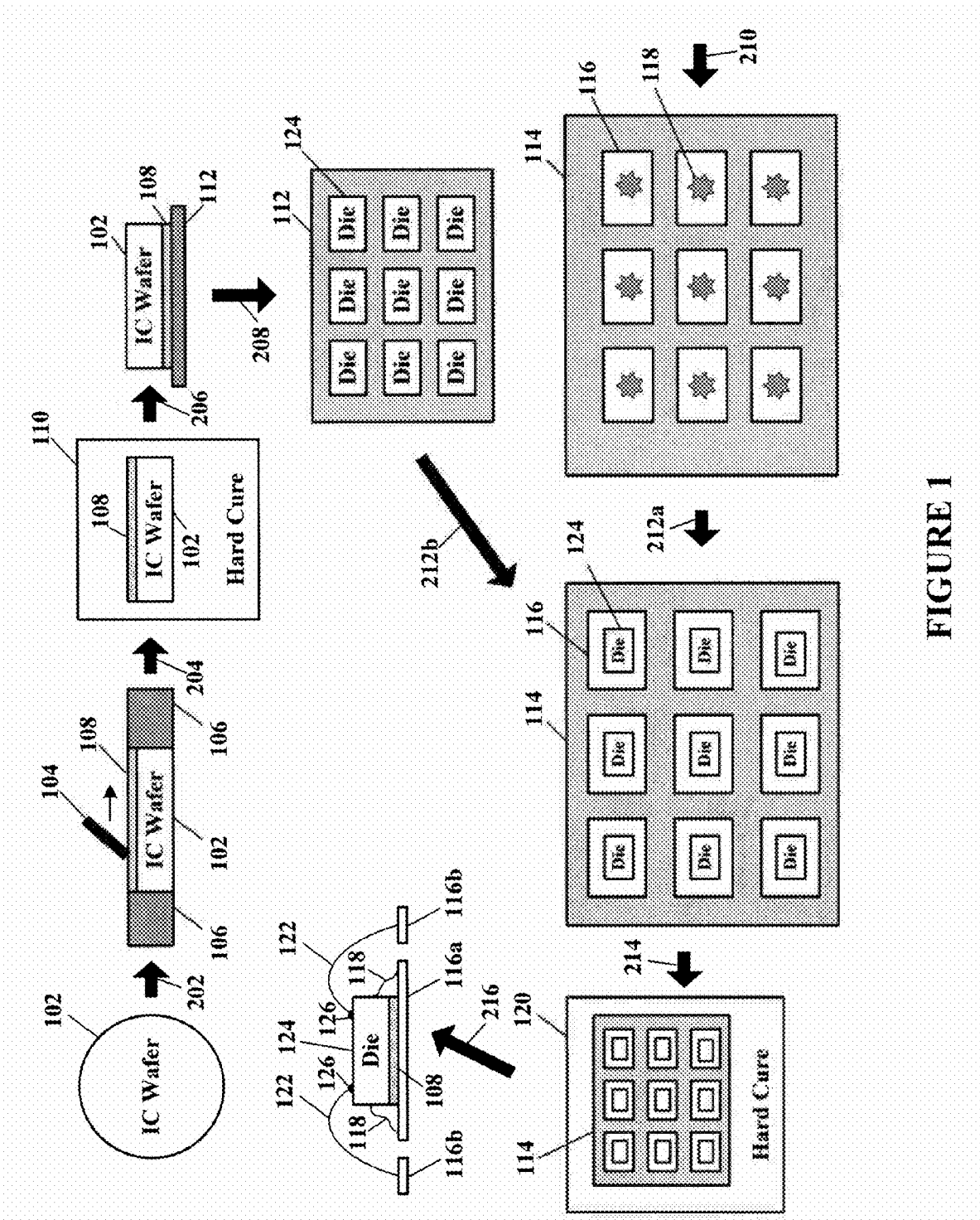
FIG. 1 is a schematic process diagram for semiconductor die attachment using non-conductive screen print and dispense adhesive, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic process diagram for semiconductor die attachment using non-conductive screen print and dispense adhesive, according to a specific example embodiment of this disclosure. A semiconductor integrated circuit wafer 102 is placed into a screen printing fixture 106, and a non-conductive material 108 is spread over the backside (non-circuit pad side) of the wafer 102 with a screen printing spreader 104. Use of the screen printing fixture 106 is well known in the art of coating surfaces. With the screen printing fixture 106, a desired pattern of non-conductive material 108 may be applied to the backside face of the wafer 102. The non-conductive material 108 may be, for example but is not limited to, epoxy and the like.

After screen printing the backside face of the wafer 102 with the non-conductive material 108, the coated wafer 102 is placed into a curing oven 110 for hard curing of the non-conductive material 108. Hard curing of the non-conductive material 108 may comprise, for example but is not limited to, heating at about 150 degrees Centigrade for about two hours. After the non-conductive material 108 has been hard cured onto the backside face of the wafer 102, the wafer 102 may be stored for extended periods of time before further processing, or the hard cured coated wafer 102 may be attached to a process substrate 112, e.g., mounting tape, so that the wafer 102 can be singulated (separated by cutting) into a plurality of semiconductor integrated circuit dice 124.

A leadframe carrier 114 comprises a plurality of leadframes 116. Each of the plurality of leadframes 116 comprises a die attach paddle 116a and leadframe conductors 116b. Leadframes 116 are well known to one having ordinary skill in the art of integrated circuit fabrication. Adhesive 118 is dispensed onto a face of each of the die attach paddles 116a. Then the singulated (separated) dice 124 are place onto the adhesive 118 on each of the respective die attach paddles 116a. The assembly of the leadframe carrier 114, plurality of leadframes 116, adhesive 118 and coated dice 124 are placed into a curing oven 120 so that the adhesive 118 is thereby hard cured. Hard curing of the non-conductive adhesive 118 may comprise, for example but is not limited to, heating at about 175 degrees Centigrade for about one hour. The adhesive material 118 is substantially non-conductive and may be, for example but is not limited to, epoxy and the like.

After the adhesive material 118 has been hard cured and cooled, the leadframes 116 are removed from the curing oven 120 and the bond pads 126 on each of the dice 124 are connected to respective ones of the leadframe conductors 116b with bond wires 122. Wire bonding of integrated circuit bond pads 126 to leadframe conductors 116b is well known to one having ordinary skill in the art of integrated circuit fabrication.

After wire bonding of each of the die bond pads 126 to respective ones of the leadframe conductors 116b, the finished integrated circuit assemblies are separated and may be encapsulated into packaged integrated circuits (not shown).

Figure 2:
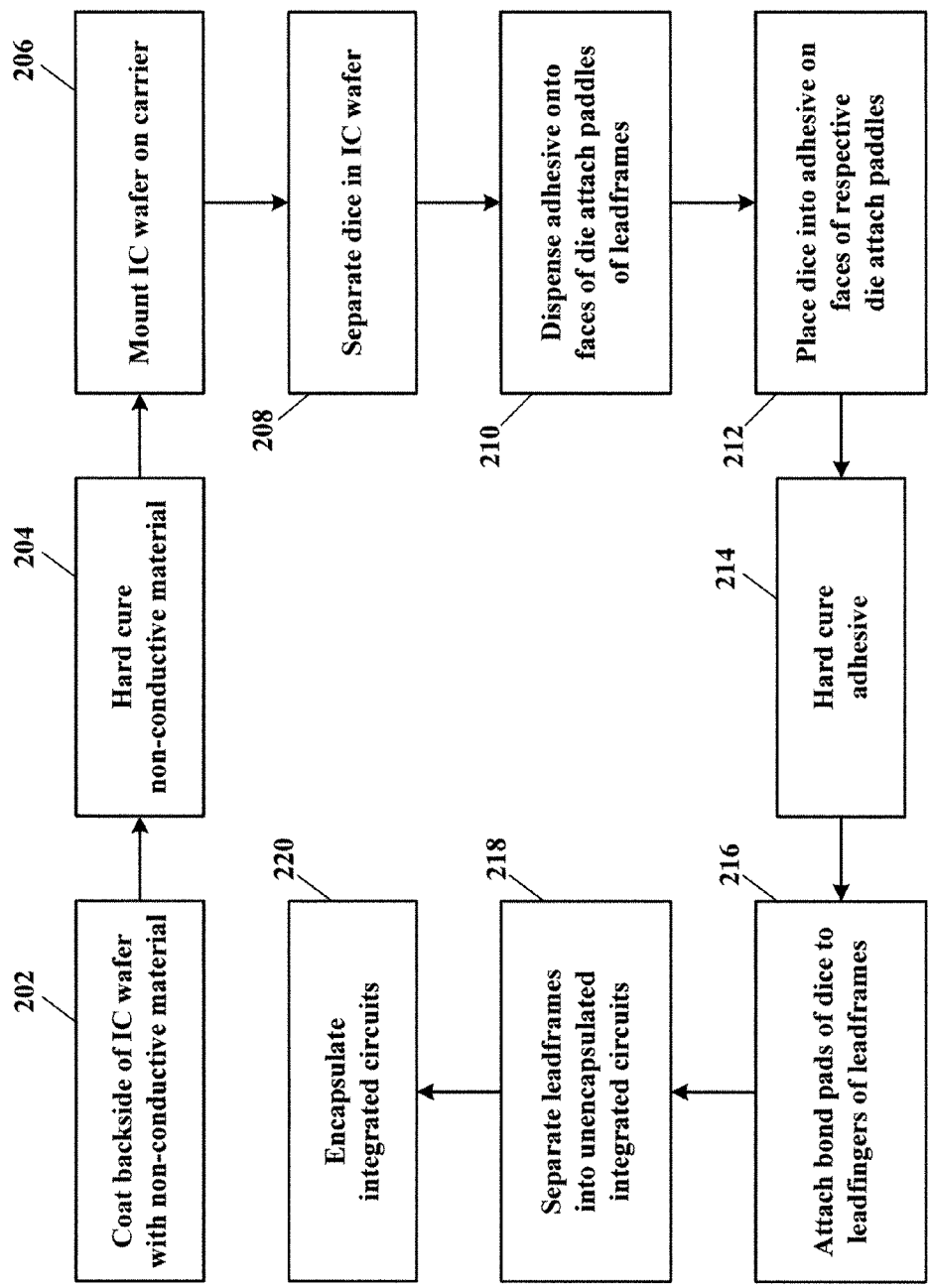
FIG. 2 is a schematic flow diagram of the semiconductor die attachment process shown in FIG. 1, according to a specific example embodiment of this disclosure.

Referring to FIG. 2, depicted is a schematic flow diagram of the semiconductor die attachment process shown in FIG. 1, according to a specific example embodiment of this disclosure. In step 202, the backside of a semiconductor integrated circuit wafer (102) is coated with non-conductive material (108). In step 204, the non-conductive material (108) coated on the backside of a semiconductor integrated circuit wafer (102) is hard cured. In step 206, the coated wafer (102) is mounted onto a carrier (112), and then in step 208 the plurality of integrated circuit dice (124) comprising the wafer (102) are separated apart from each other (singulated).

In step 210, adhesive (118) is dispensed onto faces of die attach paddles (116a) of leadframes (116) on a leadframe carrier (114). Then in step 212, the singulated integrated circuit dice (124) are placed into the adhesive (118) on the faces of the respective die attach paddles (116a). In step 214, the adhesive (118) is heated to hard cure it (C-stage). In step 216, bond pads (126) of the dice (124) are wire bonded to respective ones of the conductors (e.g., leadfingers) (116b) of the leadframes (116). In step 218 the leadframes (116) are separated from the leadframe carrier (114) to become finished integrated circuits. These finished integrated circuits may be encapsulated in step 220 to become packaged integrated circuits, as is well know in the electronics arts.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for attaching semiconductor dice to leadframe die attach paddles, said method comprising the steps of:
    applying a non-conductive material to a back face of a semiconductor integrated circuit wafer, the semiconductor integrated circuit wafer comprising a plurality of integrated circuit dice;
    heating the semiconductor integrated circuit wafer and the non-conductive material thereon until the non-conductive material is hard cured;

mounting the semiconductor integrated circuit wafer on a wafer carrier; wherein the hard cured non-conductive material is between the semiconductor integrated circuit wafer and the wafer carrier;

separating each of the plurality of integrated circuit dice from each other;

dispensing non-conductive adhesive on faces of die attach paddles of a plurality of leadframes;

placing the plurality of integrated circuit dice into the non-conductive adhesive on the faces of respective ones of the die attach paddles;

heating the plurality of integrated circuit dice and die attach paddles until the non-conductive adhesive is hard cured;

attaching bond pads of the plurality of integrated circuit dice to respective conductive leads of the plurality of leadframes with bond wires; and separating each of the plurality of leadframes into integrated circuits.

2. The method according to claim 1, further comprising the step of encapsulating the integrated circuits to produce packaged integrated circuits.

3. The method according to claim 1, wherein the non-conductive material is applied at a thickness from about one milli-inch to about three milli-inches.

4. The method according to claim 1, wherein the non-conductive material is applied at a thickness from about 1.5 milli-inches to about 2.5 milli-inches.

5. The method according to claim 1, wherein the non-conductive material is applied at a thickness of about two milli-inches.

6. The method according to claim 1, wherein the non-conductive material is epoxy.

7. The method according to claim 1, wherein the non-conductive adhesive is epoxy.

8. The method according to claim 1, wherein the step of applying the non-conductive material is done by screen printing.

9. The method according to claim 8, wherein the screen printed non-conductive material is applied in a pattern.

10. The method according to claim 1, wherein the step of heating the semiconductor integrated circuit wafer and the non-conductive material comprises the step of heating at about 150 degrees Centigrade for about two hours.

11. The method according to claim 1, wherein the step of heating the plurality of integrated circuit dice and die attach paddles until the non-conductive adhesive is hard cured comprises the step of heating at about 175 degrees Centigrade for about one hour.

* * * * *